US007564273B2

(12) United States Patent
Guyton et al.

(10) Patent No.: US 7,564,273 B2

(45) Date of Patent: Jul. 21, 2009

(54) LOW-VOLTAGE COMPARATOR-BASED SWITCHED-CAPACITOR NETWORKS

(75) Inventors: Matthew C. Guyton, Cambridge, MA (US); Hae-Seung Lee, Bedford, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 75 days.

(21) Appl. No.: 11/671,525

(22) Filed: Feb. 6, 2007

(65) Prior Publication Data

US 2008/0186077 A1 Aug. 7, 2008

(51) Int. Cl.
*G11C 27/02* (2006.01)

(52) U.S. Cl. ............................ 327/91; 327/337; 327/94

(58) Field of Classification Search ............. 327/91–96, 327/337

See application file for complete search history.

(56) References Cited

U.S. PATENT DOCUMENTS

| | | | | |
|---|---|---|---|---|
| 3,577,007 A | | 5/1971 | Cross | |
| 3,956,645 A | | 5/1976 | Boer | |
| 4,633,223 A | | 12/1986 | Senderowicz | |
| 4,965,711 A | | 10/1990 | Kamp et al. | |
| 5,387,882 A | | 2/1995 | Schoofs | |
| 5,585,756 A | * | 12/1996 | Wang | 327/341 |
| 5,636,048 A | * | 6/1997 | Kogure et al. | 398/202 |
| 5,745,002 A | * | 4/1998 | Baschirotto et al. | 327/554 |
| 5,796,300 A | | 8/1998 | Morgan | |
| 5,909,131 A | | 6/1999 | Singer et al. | |
| 5,973,537 A | | 10/1999 | Baschirotto et al. | |
| 6,201,489 B1 | * | 3/2001 | Castellucci et al. | 341/111 |
| 6,344,767 B1 | * | 2/2002 | Cheung et al. | 327/336 |
| 6,563,363 B1 | | 5/2003 | Tay | |
| 2005/0105307 A1 | * | 5/2005 | Shearon et al. | 363/49 |
| 2006/0208938 A1 | * | 9/2006 | Fiorenza et al. | 341/172 |

OTHER PUBLICATIONS

Jan Crols et al., "Switched-Opamp: An Approach to Realize Full CMOS Switched-Capacitor Circuits at Very Low Power Supply Voltages", IEEE Journal of Solid-State Circuits, pp. 936-942, vol. 29, No. 8, Aug. 1994.

(Continued)

*Primary Examiner*—Lincoln Donovan
*Assistant Examiner*—Ryan C Jager
(74) *Attorney, Agent, or Firm*—Guerin & Rodriguez, LLP; William G. Guerin

(57) ABSTRACT

Described is a switched-capacitor network and method for performing an analog circuit function. The circuit includes a switched-capacitor network, a comparator, and a voltage-offset network. The switched-capacitor network includes multiple switches, each having a respective threshold voltage and connected to one of a high-limit voltage, a low-limit voltage, and electrical ground. A first comparator input terminal in communication with the switched-capacitor network is configured to receive a node voltage therefrom during a first phase. The second input terminal is configured to receive one of the high-limit voltage and the low-limit voltage. The voltage-offset network provides a voltage shift at the first input terminal setting an input reference level at a mid-level voltage with respect to the high-limit voltage and the low-limit voltage. The voltage shift enables the first terminal to receive full-swing voltages when the high-limit voltage is less than twice the threshold voltage, with power supply voltages below twice the threshold voltage.

21 Claims, 10 Drawing Sheets

OTHER PUBLICATIONS

Mikko Waltari et al., "1-V 9-Bit Pipelined Switched-Opamp ADC", IEEE Journal of Solid-State Circuits, pp. 129-134, vol. 36, No. 1, Jan. 2001.

Soundarapandian Karthikeyan et al., "Design of Low-Voltage Front-End Interface for Switched-Opamp Circuits", IEEE Transactions on Circuits and Systems—II: Analog and Digital Signal Processing, pp. 722-726, vol. 48, No. 7, Jul. 2001.

Andrea Baschirotto et al., "A 1-V 1.8-MHz CMOS Switched-Opamp SC Filter with Rail-to-Rail Output Swing", IEEE Journal of Solid-State Circuits, pp. 1979-1986, vol. 32, No. 12, Dec. 1997.

Vincenzo Peluso et al., "A 900-mV Low-Power Delta Sigma A/D Converter with 77 -dB Dynamic Range", IEEE Journal of Solid-State Circuits, pp. 1887-1897, vol. 33, No. 12, Dec. 1998.

International Search Report for PCT/US2007/084932 dated May 16, 2008; 2 Pages.

* cited by examiner

LOW-VOLTAGE COMPARATOR-BASED SWITCHED-CAPACITOR NETWORKS

FIELD OF THE INVENTION

The present invention relates generally to switched-capacitor circuits and, more particularly, to low-voltage switched-capacitor circuits for comparator-based integrated circuits.

BACKGROUND OF THE INVENTION

Modern scaled complementary metal-oxide semiconductor (CMOS) processes are typically optimized for digital circuits. Process advancements such as lower voltage power supplies and shorter gate lengths result in low power, high-speed digital circuits, but can also result in higher power, low performance analog circuits. Lower output resistance, reduced power supply voltage, increased threshold variation and gate leakage present design challenges for analog and mixed signal systems.

The design of high-gain operational amplifiers (hereinafter op-amps) is one example of a design challenge resulting from the continued scaling of CMOS processes. High gain op-amps are critical components of many analog and mixed-signal circuits, and are especially important in switched-capacitor implementations of analog circuits including integrators, filters and other applications including analog-to-digital converters. As gate length decreases, the intrinsic gain per unit current of a device also decreases. Although a smaller gate length increases the transconductance $g_m$, the reduction in the output resistance $r_0$ dominates. Moreover, it is not practical to maintain an acceptable intrinsic gain per unit current by using longer devices in a scaled implementation, especially when increased frequency capability is required. In addition, the output resistance of modern scaled devices is not linearly proportional to gate length; increasing the gate length does not significantly increase the output resistance of the device.

Scaled processes generally utilize lower voltages to prevent gate oxide damage or device breakdown during operation. To achieve satisfactory gain in an amplifier designed in a scaled process, it is often necessary to utilize a cascode topology; however, a cascode topology using a reduced supply voltage generally results in a substantially reduced voltage swing. Modern low-voltage scaled processes result in inherently less gain and voltage swing than older processes, consequently widely used analog design styles such as switched-capacitor networks need to be modified to compensate for these effects. Switched-capacitor circuits demand high performance from op-amps included in the circuits. In a highly scaled CMOS process it is generally difficult to achieve the required op-amp performance.

SUMMARY OF THE INVENTION

The present invention addresses the design challenges associated with the use of high-gain op-amps within switched-capacitor circuits, by incorporating a comparator-based architecture in place of the high-gain op-amps. The comparator-based switched-capacitor circuits can be combined with low-voltage techniques to enable operation at supply levels approaching a single transistor gate threshold voltage.

In one aspect, the invention features a switched-capacitor network for performing an analog circuit function. The circuit includes a switched-capacitor network having an input terminal to receive an input voltage and multiple switches, each switch has a respective threshold voltage. Each switch is in communication with one of a high-limit voltage, a low-limit voltage, and electrical ground. The circuit also includes a comparator having an output terminal, a first input terminal, and a second input terminal. The first input terminal is in communication with the switched-capacitor network and is configured to receive a node voltage from the switched-capacitor network during a first phase for sampling the input voltage. The second input terminal is configured to receive one of a high-limit voltage and a low-limit voltage. The circuit also includes a voltage-offset network in communication with the first input terminal. The voltage-offset network provides a voltage shift at the first input terminal, setting an input reference level at a mid-level voltage with respect to the high-limit and low-limit voltages. Also included in the circuit is a controllable current source coupled between the output terminal and one of the high-limit and low-limit voltages. The controllable current source has a control input coupled to the output terminal of the comparator. A current is supplied by the controllable current source during a second phase, sweeping the output voltage toward the other one of the high-limit and low-limit voltages.

In another aspect, the invention features a method for performing an analog circuit function in a circuit that includes a comparator in communication with a switched-capacitance network. An input voltage is sampled by the switched-capacitance network during a first phase. The switched-capacitance network includes multiple switches each having a respective threshold voltage and in communication with one of a high-limit voltage, a low-limit voltage, and electrical ground. A voltage present at a node within the switched-capacitance network is applied to a first comparator input terminal. One of the high-limit voltage and the low-limit voltage is applied to a second comparator input terminal, and a voltage shift is applied to the first comparator input terminal. The applied voltage shift sets an input reference level at a mid-level voltage with respect to the high-limit voltage and the low-limit voltage.

BRIEF DESCRIPTION OF THE DRAWINGS

The above and further advantages of this invention may be better understood by referring to the following description in conjunction with the accompanying drawings, in which like numerals indicate like structural elements and features in the various figures. The drawings are not necessarily to scale, emphasis instead being placed upon illustrating the principles of the invention.

DETAILED DESCRIPTION

In brief overview, the present invention relates to a comparator-based switched-capacitor network for performing an analog circuit function under low-voltage conditions. The circuit includes a switched-capacitor network, a comparator, and a voltage-offset network. Other techniques are used to enable operation at low voltages. Fore example, in a CMOS implementation, individual switches of the switched-capacitor network are implemented as PMOS or NMOS-only transistors. Each switch is coupled to one of three reference values: a high-limit voltage, a low-limit voltage, or an electrical ground potential. The use of any series-connected switches that are not coupled to one of these reference values is avoided. The high-limit and low-limit voltages are close to power supply rail voltages. This leaves some headroom to avoid inadvertently turning on any of the switches or forward biasing any junction due to an overshoot condition.

An input voltage is sampled by the switched-capacitor network during a first phase. A node voltage of the switched-capacitor network reflective of the sampled input voltage is applied to a first input terminal of the comparator. A second comparator input terminal providing a reference level is coupled to the low-limit voltage. The voltage-offset network provides a voltage shift at the first input terminal setting an input reference level at a mid-level voltage with respect to the high-limit and low-limit voltages. The voltage shift enables the first terminal to receive full-swing voltages when the high-limit voltage is less than twice the threshold voltage.

A second switched-capacitor network is connected between the first comparator input terminal and circuit output terminal, providing a circuit output voltage thereon. A reset circuit temporarily pulls the output voltage to one of the high-limit and low-limit voltages during a reset phase. A controllable current source is coupled to the circuit output terminal with its control input coupled to the comparator output terminal. The current source transfers charge from the second switched-capacitor network, driving the output voltage towards an opposite one of the limiting voltages during a second phase. The resulting charge transfer also alters the potential at the first comparator input terminal through the second switched capacitor network. At a "correct" value, the comparator output changes state causing the current source to turn off. After the current source is turned off, the output voltage remains substantially constant until at least the conclusion of the second phase. The resulting output voltage level generally depends upon charge previously stored within the second switched capacitor network, the sampled input voltage, and component values.

The resulting circuit can be implemented as an integrator and used as a basic building block for a variety of analog and mixed-signal circuit applications, including filters and analog-digital converters.

Figure 1:
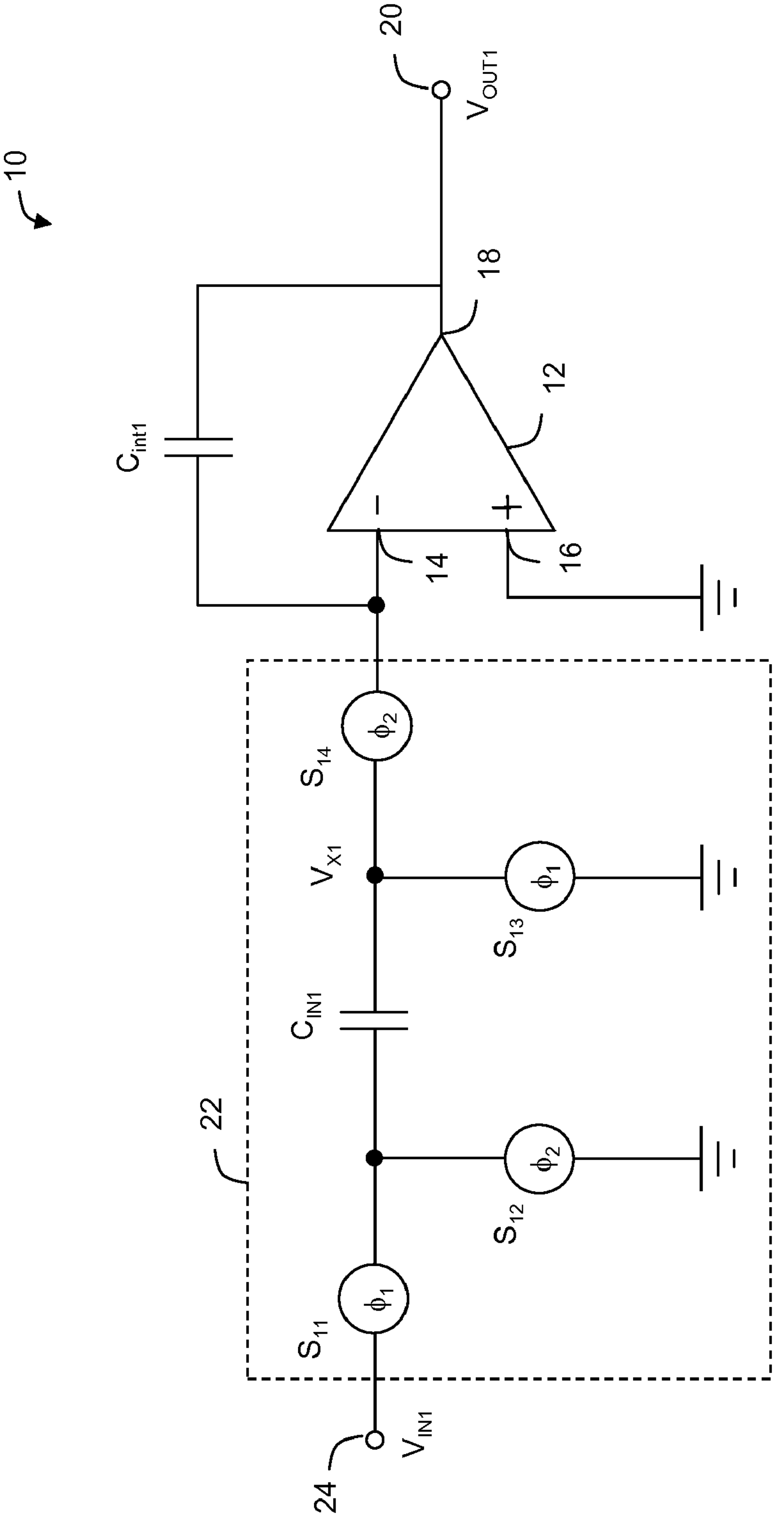
PRIOR ART FIG. 1
FIG. 1 is a circuit diagram of a conventional switched-capacitor integrator.

A conventional switched-capacitor integrator 10 is shown in FIG. 1. The integrator 10 includes an op-amp 12 having an output terminal 18, a non-inverting input terminal 14, and an inverting input terminal 16. The op-amp's output terminal 18 is coupled to a circuit output terminal 20. A feedback capacitor $C_{int1}$ is coupled between the output terminal 18 and the inverting input terminal 14. The non-inverting input terminal 16 is coupled to a ground reference potential. A switched-capacitor network 22 is coupled between the inverting terminal 14 and a circuit input terminal 24.

The switched-capacitor network 22 includes an input capacitor $C_{IN1}$ coupled at a first terminal to the input terminal 24 through a first series-connected switch $S_{11}$ and at a second terminal to the inverting terminal 14 through a second series-connected switch $S_{14}$. A first shunt-connected switch $S_{12}$ is connected between the first terminal of the input capacitor $C_{IN1}$ and electrical ground. A second shunt-connected switch $S_{13}$ is similarly connected between the second terminal of the input capacitor $C_{IN1}$ and electrical ground. A reference node $V_{X1}$ is defined at the interconnection of the second terminal of the input capacitor $C_{IN1}$, the second shunt-connected switch $S_{13}$ and the second series-connected switch $S_{14}$.

Circuit operation is controlled by two non-overlapping clock phases: an input, or a sampling phase $\phi_1$ and an evaluation phase $\phi_2$. The clock phases are used to control the switches $S_{11}$, $S_{12}$, $S_{13}$, $S_{14}$ between on and off (i.e., short-circuited and open-circuited) states. Different sets of clock phases applied to the switches result in different integrator transfer functions. As one example, a clock phasing that results in stray-insensitive inverting integration is now described. Each of the switches $S_{11}$, $S_{12}$, $S_{13}$, $S_{14}$ is marked with a respective one of the two phases $\phi_1$, $\phi_2$, indicating which of the phases is used to control the switch. In particular, during the sampling phase $\phi_1$, the first series connected switch $S_{11}$ and the second shunt-connected switch $S_{13}$ are closed; whereas, the second series-connected switch $S_{14}$ and the first shunt-connected switch $S_{12}$ are opened. In this configuration, the input voltage $V_{IN1}$ is applied to the first terminal of the input capacitor $C_{IN1}$, depositing a charge onto the input capacitor $C_{IN1}$ resulting in a sampling of input signal $V_{IN}$ onto the input capacitor $C_{IN1}$.

During the evaluation phase $\phi_2$, the first series-connected switch $S_{11}$ and the second shunt-connected switch $S_{13}$ are opened; whereas, the second series-connected switch $S_{14}$ and the first shunt-connected switch $S_{12}$ are closed. In this configuration, at least a portion of the charge stored on the input capacitor $C_{IN1}$ results in a node voltage $V_X$, that disturbs the virtual ground condition when coupled to the inverting terminal 14. The inverting terminal 14 can also be referred to as a virtual ground terminal 14 in that it resides at the same potential as the non-inverting terminal 16 (i.e., ground) under stead-state conditions. In this configuration, the op-amp 12 is also connected in a negative feedback topology, with its output terminal 18 connected to the virtual ground terminal 14 through the feedback capacitor $C_{int1}$. Through such a connection the output of the op-amp 12 drives the voltage at its inverting input terminal 14 until it equals the voltage at its non-inverting input terminal 16 in steady-state. In this manner, the op-amp forces the virtual ground node $V_{X1}$ to a virtual ground potential during the second phase $\phi_2$, thereby redistributing charge between the input capacitor $C_{IN1}$ and the feedback capacitor $C_{int1}$.

Through the principle of charge conservation, charge originally stored on the input capacitor $C_{IN1}$ has effectively been moved to the feedback, or integrating capacitor $C_{int1}$, resulting in a change in output voltage $\Delta V_{OUT1}$ at the circuit output terminal 20 as described in Equation 1.

$$\Delta V_{OUT1}=V_{IN1}*[C_{IN1}/C_{int1}] \quad (1)$$

Because the change in output voltage $\Delta V_{OUT1}$ is proportional to the input voltage $V_{IN1}$, this circuit 10 functions as an integrator. Note that the op-amp 12 in this switched-capacitor system 10 consumes static power to maintain the virtual ground node voltage at all times.

All switches $S_{11}$, $S_{12}$, $S_{13}$, and $S_{14}$ are connected either to electrical ground or virtual ground with the exception of the input series switch $S_{11}$. For low-voltage conditions in which the supply voltage ($V_{DD}$) approaches a transistor threshold voltage, a CMOS transmission gate configuration of the series switch $S_{11}$ would be unable pass mid-level voltages. Such a series switch $S_{11}$ coupled to the input terminal 24 therefore limits the useful input voltage range under low-voltage conditions. Unable to pass mid-level voltages, the circuit 10 is unable to accommodate full-swing input voltage $V_{IN1}$ without distortion.

An approach referred to as a "switched-op-amp technique" uses circuit topologies that avoid problems associated with passing full-swing voltage signals through series connected switches. In switched-op-amp topologies, each of the switches $S_{11}$, $S_{12}$, $S_{13}$, and $S_{14}$ operates under a respective constant voltage level near a power supply rail voltage (e.g., $V_{DD}$, $V_{SS}$, or ground). Consequently, each of the switches $S_{11}$, $S_{12}$, $S_{13}$, and $S_{14}$ can be implemented in either PMOS-only or NMOS-only, without the need for having a transmission gate configuration. Whether a switch is PMOS or NMOS generally depends whether the switch is connected to $V_{DD}$ or ground. For example, NMOS switches can be used in connecting to $V_{SS}$ or ground; whereas, PMOS switches can be used to connect to $V_{DD}$. Without CMOS transmission gate switches, signal distortion is avoided under low-voltage operation. Additionally, a DC operating point of the virtual ground node is also chosen to be close to one of the power supply rails ($V_{DD}$, $V_{SS}$, or ground), rather than the middle voltage, commonly referred to as the common-mode voltage.

To accommodate full-scale input voltages $V_{IN1}$, the input series-connected switch $S_{11}$ is eliminated altogether. In the case of cascaded integrators (multiple stages connected in an output terminal 20 to input terminal 24 fashion), the function of the removed series-connected switch $S_{11}$ is performed by enabling/disabling the output of the preceding integrator. Disabling the output of the preceding integrator can be accomplished by switching off the amplifier that drives that output. Because no full-swing voltage signals are passed through any of the remaining switches $S_{12}$, $S_{13}$, $S_{14}$, switched-op-amp topologies can work at power supply voltages as low as $V_{DD,min}\approx V_t$ where $V_t$ represents the larger of $V_{tn}$ (the NMOS threshold voltage) or $|V_{tp}|$ (the absolute value of the PMOS threshold voltage).

One difficulty associated with the switched-op-amp topology occurs in the input of the first integrator stage, where there is no preceding op-amp to turn off. More generally, there is no guarantee about what kind of circuitry provides the input voltage $V_{IN1}$. Thus, circuitry is designed to allow for a voltage difference between the output terminal of the previous stage and the input terminal 10 of the first integrator stage.

In some embodiments, the integrator input 24 is protected by a series-connected input resistor $R_{IN}$. Such a resistor $R_{IN}$ limits the maximum current that can be drawn by the input terminal 24. Unfortunately, such an input resistor $R_{IN}$ low-pass filters the input signal by the combination of the input resistor $R_{IN}$ and the input capacitor $C_{IN1}$. To minimize any undesirable effects, these component values should be chosen such that the resulting bandwidth of the R-C filter is substantially greater than the anticipated input signal bandwidth.

In some embodiments, the value of the series-connected input resistor $R_{IN}$ is chosen as a compromise between the effective off and on output resistance values $R_{OFF}$, $R_{ON}$ of the replaced series-connected switch $S_{11}$. The series-connected input resistor $R_{IN}$ is chosen to be large enough to avoid shorting the output of the previous stage during the evaluation phase $\phi_2$. The series-connected input resistor $R_{IN}$ is also chosen to be small enough to prevent the resulting R-C low-pass filter from excessively filtering the input signal. It should be noted that similar to their switched-capacitor counterparts, switched-op-amp topologies also require high-gain op-amps, with the added requirement that these op-amps include an enable/disable feature.

In accordance with the principles of the present invention, the switched-op-amp technique is combined with comparator-based architectures resulting in relaxed requirements for comparator-based switched-capacitor topologies. One possible application of the combined technique has been demonstrated in the form of a low-voltage comparator-based switched-capacitor integrator.

Figure 2A:
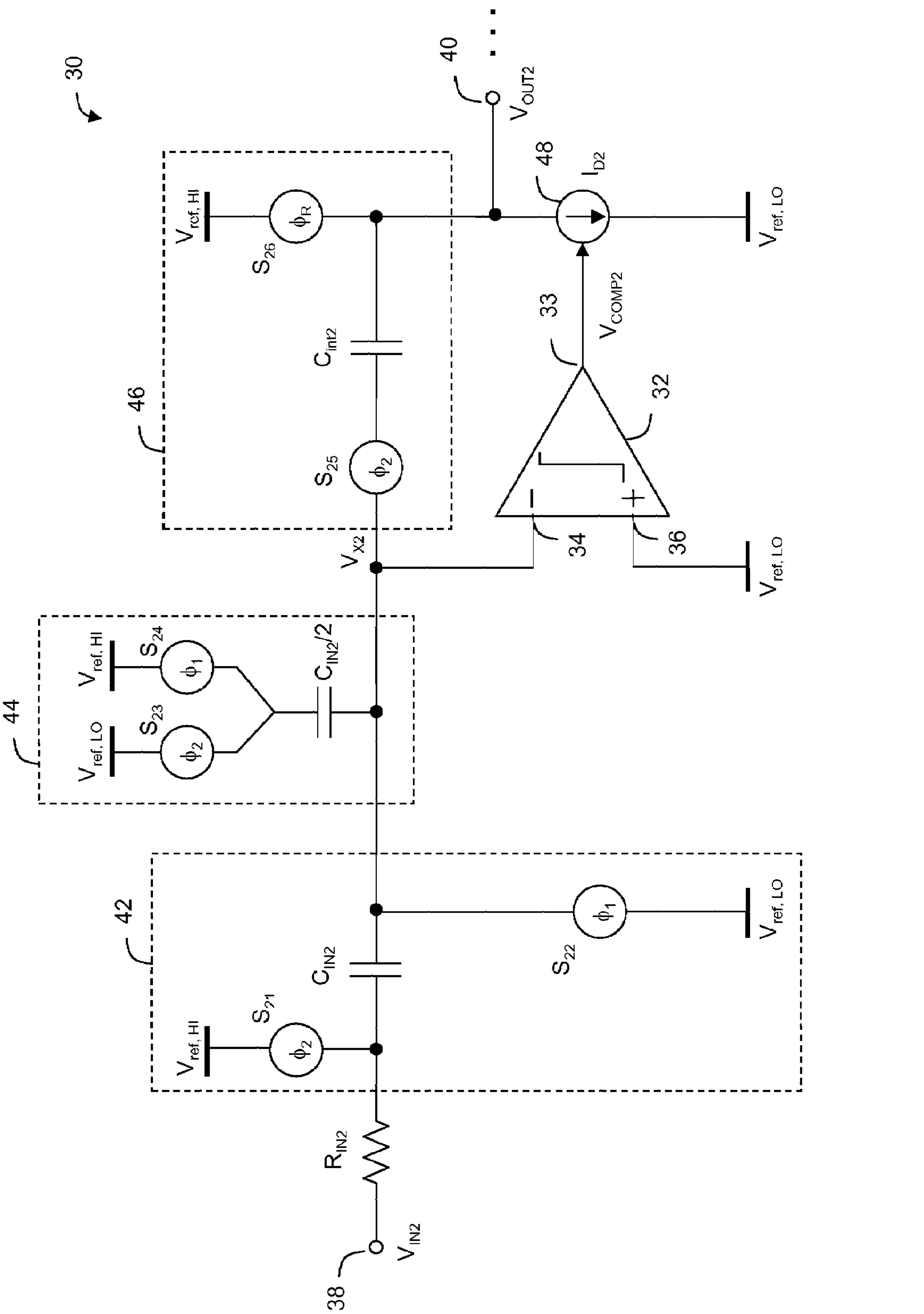
FIG. 2A is a circuit diagram of an embodiment of a comparator-based switched-capacitor network in accordance with the present invention.

FIG. 2A is a circuit diagram of a first embodiment of a comparator-based switched-capacitor integrator 30 in accordance with the present invention. The integrator 30 includes a comparator 32 having an output terminal 33, an inverting input terminal 34, and a non-inverting input terminal 36. A first switched-capacitor network 42 is coupled between an integrator input terminal 38 and the comparator's inverting terminal 34. A second switched-capacitor network 46 is coupled between an integrator output terminal 40 and inverting comparator input terminal 34. The non-inverting input terminal 36 is further coupled to a low-limit source $V_{ref,LO}$, close to one of the power supply rails (e.g., $V_{SS}$) rather than the ground reference potential of the op-amp circuit 10 (FIG. 1).

The first switched-capacitor network 42 includes a series-connected input capacitor $C_{IN2}$ coupled at one end to the input terminal 38 through a series-connected input resistor $R_{IN2}$ and at another end to the comparator's inverting terminal 34. The series-connected input resistor $R_{IN2}$ is provided in a first input stage circuit in place of a series-connected input switch $S_{11}$ (FIG. 1). A first shunt-connected switch $S_{21}$ is connected between the input terminal of the input capacitor $C_{IN2}$ and a high-limit source $V_{ref,HI}$. A second shunt-connected switch $S_{22}$ is connected between the output terminal of the input capacitor $C_{IN2}$ and the low-limit source $V_{ref,LO}$. A reference node $V_{X2}$ is defined between the first switched capacitor network 42, the comparator's inverting input terminal 34, the second shunt-connected switch $S_{22}$ and a series-connected feedback switch $S_{25}$.

The values of the high and low-limit sources $V_{ref,HI}$, $V_{ref,LO}$ are close to, but not equal to the power supply rail voltages ($V_{DD}$, $V_{SS}$), allowing for some overshoot of the output signal. Without some allowance for overshoot, the voltage at node $V_{X2}$ might exceed the power supply rails during output voltage sweeping because of comparator delay. This overshoot would forward bias the normally reverse biased PN junctions of the transistor switches, leading to inaccuracy through loss of charge.

The second switched-capacitor network 46 includes a feedback capacitor $C_{int2}$ coupled between the circuit output terminal 40 and one end of the series-connected feedback switch $S_{25}$. One end of the feedback capacitor $C_{int2}$ is also coupled to the high-limit source $V_{ref,HI}$ through a series-connected reset switch $S_{26}$. The other end of the feedback switch $S_{25}$ is coupled to the comparator's inverting input terminal 34. In the exemplary embodiment, the circuit output terminal 40 is also connected to the low-limit source $V_{ref,LO}$ through a current source 48. In other embodiments, the current source could source current from a different voltage than $V_{ref,LO}$. The current source 48 providing a substantially constant current $I_{D2}$ is controllable by an output signal $V_{COMP2}$ provided at the comparator's output terminal 33.

An offset voltage network 44 is coupled between each of the high-limit and low-sources $V_{ref,HI}$, $V_{ref,LO}$ and the reference node $V_{X2}$. The offset voltage network 44 includes an offset capacitor $C_{IN2}/2$ coupled at one end to the reference node $V_{X2}$. The other end of the offset capacitor $C_{IN2}/2$ is coupled to the low-limit source $V_{ref,LO}$ through a first series-connected switch $S_{23}$ and to the high-limit source $V_{ref,HI}$ through a second series-connected switch $S_{24}$. As indicated, in some embodiments the capacitance of the offset capacitor is approximately half the value of the input capacitor $C_{IN2}$ to produce a desired effect of setting an input reference voltage at mid-level with respect to the high-limit and low-limit sources $V_{ref,HI}$, $V_{ref,LO}$.

Circuit operation is controlled by three timing phases: an input, or sampling phase $\phi_1$; a non-overlapping output, or evaluation phase $\phi_2$; and a brief reset phase $\phi_R$. Thus, the phases of the integration cycle are: Input⇒Reset⇒Output.

Figure 3:
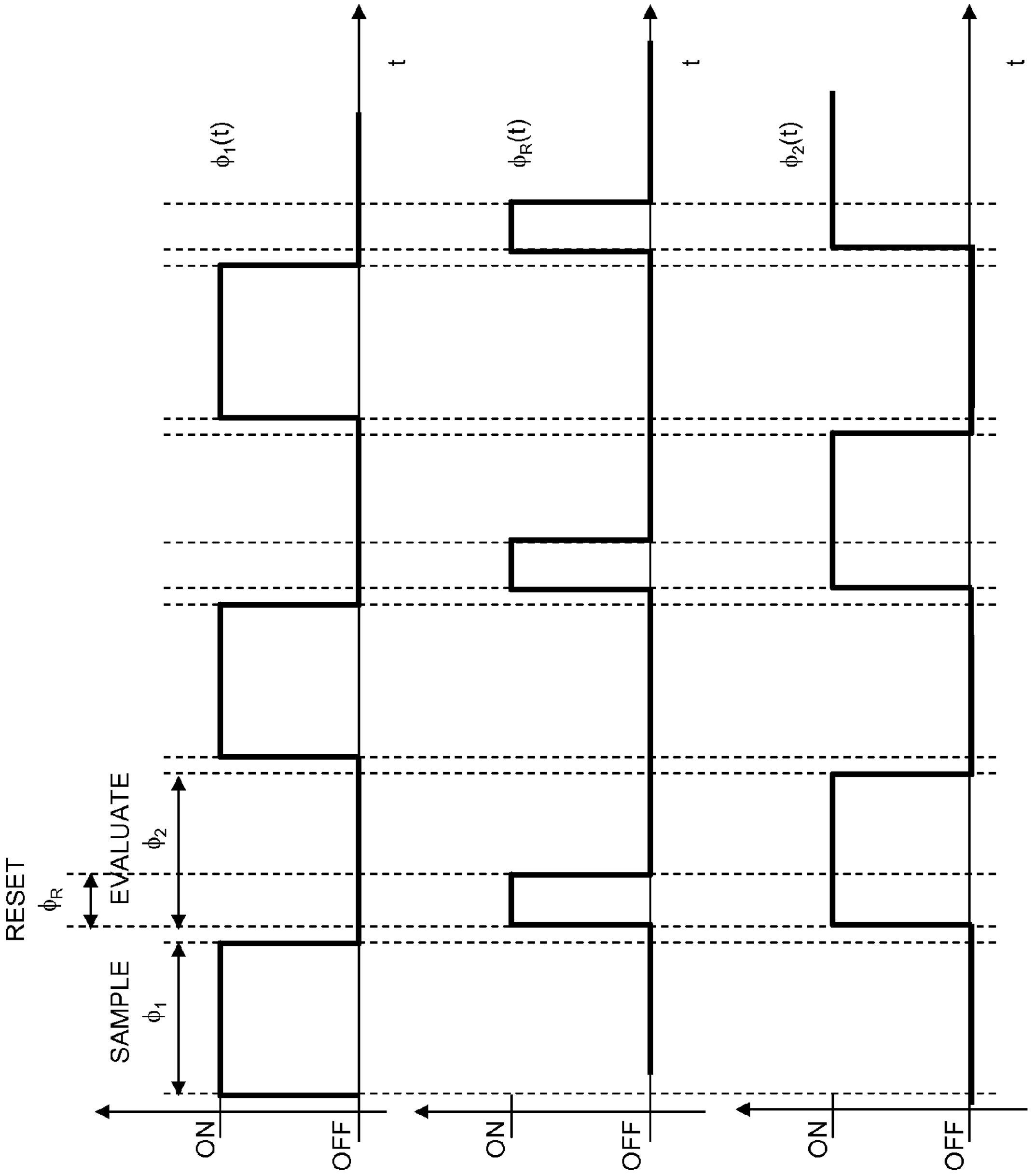
FIG. 3 is an exemplary timing diagram showing non-overlapping clock signals used to control the switches in the circuit of FIG. 2.

FIG. 3 is an exemplary timing diagram showing clock signals used to control the switches of the comparator-based switched-capacitor integrator 30. The input phase $\phi_1$ is ON for a sample period and OFF elsewhere. The output phase $\phi_2$ is ON during an evaluation period and OFF elsewhere. The input and output phases $\phi_1$, $\phi_2$ do not overlap. In some embodiments, a brief reset phase $\phi_R$ overlaps an initial portion of the output phase $\phi_2$.

Figure 4A:
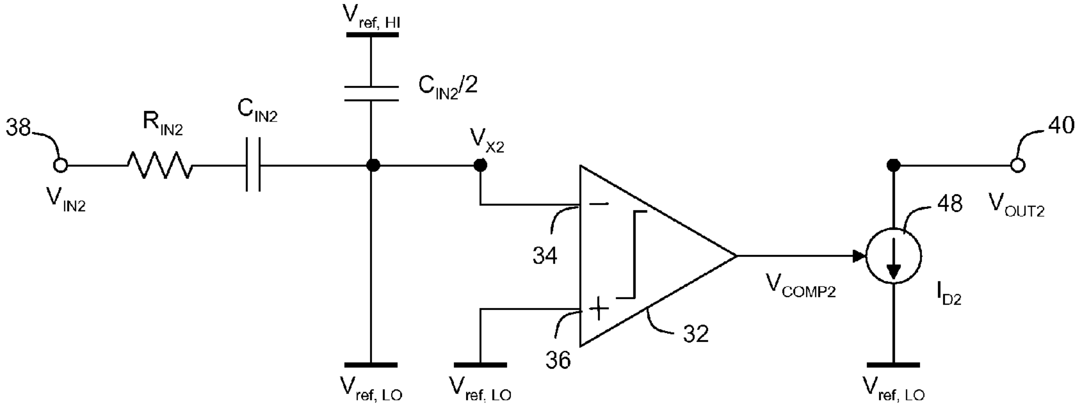
FIG. 4A is a circuit diagram depicting the effective circuit of FIG. 2 during a sampling phase.

FIG. 4A is a circuit diagram depicting the effective circuit of FIG. 2A during the input phase $\phi_1$. With the input phase $\phi_1$ ON, the second shunt-connected switch $S_{22}$ of the first switched-capacitor network 42 and the second series-connected switch $S_{24}$ of the offset voltage network 44 are closed and have been replaced by short circuits. With the output phase $\phi_2$ OFF the first shunt-connected switch $S_{21}$, the second series connected switch $S_{24}$ and the series-connected feedback switch $S_{25}$ are open and have been replaced by open circuits. For the exemplary embodiment in which the reset phase $\phi_R$ overlaps a portion of the output phase $\phi_2$, the reset switch $S_{26}$ is also OFF and has been replaced by an open circuit.

During the input phase $\phi_1$, the input capacitor $C_{IN2}$ is coupled between the input voltage $V_{IN2}$ and the low-limit source $V_{ref,LO}$ through the series input resistor $R_{IN2}$. Consequently, an input-dependent charge, $\Delta Q_X$, is deposited onto the summing node $V_{X2}$. Likewise, the offset capacitor $C_{IN2}/2$ is coupled between $V_{ref,HI}$ and $V_{ref,LO}$ and charged to a preset value.

During the output phase $\phi_2$, the charge $\Delta Q_X$ deposited on the summing node $V_{X2}$ is transferred to the feedback capacitor $C_{int2}$ by manipulating the output voltage, $V_{OUT2}$ until the summing node voltage $V_{X2}$ is restored back to virtual ground.

Figure 4B:
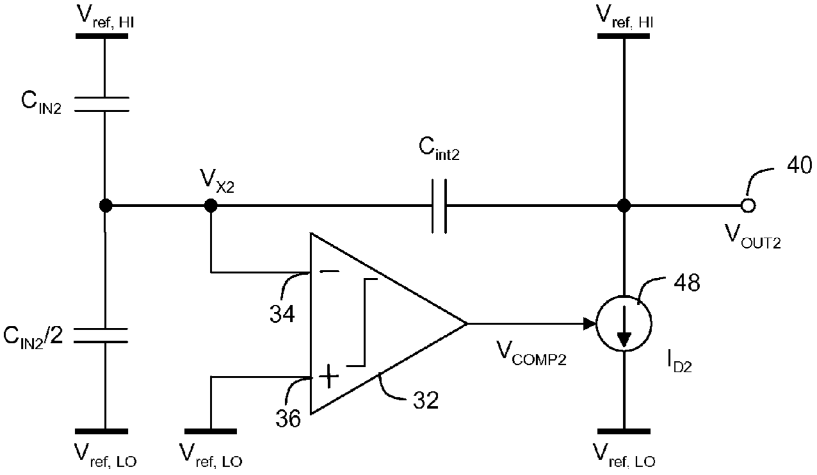
FIG. 4B is a circuit diagram depicting the effective circuit of FIG. 2 during a reset phase.

FIG. 4B is a circuit diagram depicting the effective circuit of FIG. 2A during a reset phase $\phi_R$. With the reset signal $\phi_R$ ON, the reset switch $S_{26}$ of the second switched-capacitor network 46 is closed and has been replaced by a short circuit. Because the reset phase $\phi_R$ overlaps an initial portion of the output phase $\phi_2$, the first shunt-connected switch $S_{21}$ of the first switched-capacitor network 42, the first series-connected switch $S_{23}$ of the offset voltage network 44, and the series-connected feedback switch of the second switched-capacitor network 46 are also closed and have been replaced by short circuits. With the first timing signal $\phi_1$ OFF the second shunt-connected switch $S_{22}$ and the second series connected switch $S_{24}$ are open and have been replaced by open circuits.

In this configuration, the input side of the previously charged input capacitor $C_{IN2}$ is pulled up to the high-limit source $V_{ref,HI}$; the previously charged voltage offset capacitor $C_{IN2}/2$ is pulled down to the low-limit source $V_{ref,LO}$; and the output 40 is coupled to the comparator input terminal 34 through the feedback capacitor $C_{int2}$.

During the reset phase $\phi_R$, the circuit output terminal 40 is shorted (i.e., reset) to one of the high-limit and low-limit sources $V_{ref,HI}$, $V_{ref,LO}$. In the exemplary embodiment, the output terminal 40 is shorted to the high-limit source, $V_{ref,HI}$. In other embodiments, the output terminal 46 can be shorted to the low-limit source $V_{ref,LO}$. For applications, such as the exemplary integrator 30, it is also important to preserve any charge previously stored on the integrating capacitor $C_{int2}$. With the switch configuration described above, any stored charge will be distributed among all of the coupled capacitors $C_{int2}$, $C_{IN2}$, $C_{IN2}/2$. The redistribution of charge results in a change of the potential of the summing node $V_{X2}$, altering the voltage relationship between the two input terminals 34, 36 and causing the output state $V_{COMP}$ of the comparator 32 to "flip." For example, the output of the comparator changes from a HIGH state to a LOW state. The output state $V_{COMP}$ controls operation of the current source 48. For example, a LOW state turns the current source 48 on, such that a substantially constant current value $I_{D2}$ flows in the direction indicated from the output terminal 40 (from the integration capacitor $C_{int2}$) to the low limit source $V_{ref,LO}$, effectively discharging the output 40.

Figure 4C:
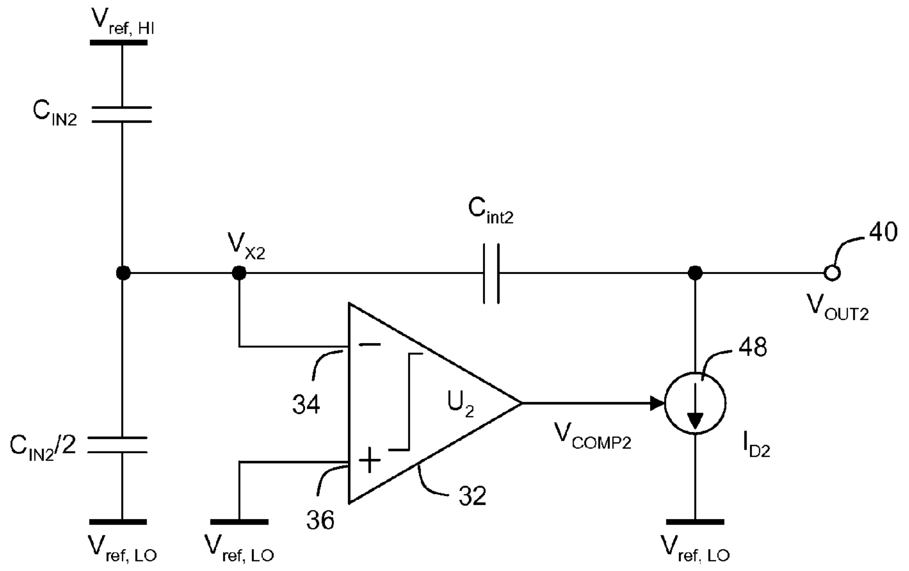
FIG. 4C is a circuit diagram depicting the effective circuit of FIG. 2 during an evaluation phase.

At the end of the reset phase ϕR, the reset switch S26 opens and is replaced by an open circuit. All other switches remain unchanged. FIG. 4C is a circuit diagram depicting the effective circuit of FIG. 2A during an evaluation phase. During the output, or evaluation phase, the current source 48 sweeps the output voltage VOUT2 linearly towards the opposite limit source thereby discharging the output voltage VOUT2. When the virtual ground node VX2 reaches a threshold of the comparator, nominally equal to the voltage Vref, LO applied to the non-inverting input 36, the comparator output VCOMP2 changes state again. As the comparator output state VCOMP2 had been LOW state, it transitions to a HIGH state. This transition controls the current source 48, effectively turning off the current source 48. The output voltage VOUT2 is then held constant for at least the remainder of the evaluation phase ϕ2. A slower (second) controllable current source 51 can be used to reverse the overshoot that is caused by comparator delay as shown in FIG. 2C.

The central idea behind comparator-based switched-capacitor designed is that the output of the sampled system need only be correct at the instant the sample of the output voltage is taken at the end of the evaluation phase. In a switched-capacitor integrator 30, this means that the voltage of the virtual ground node $V_{X2}$ need only be correct at the sampling instant defined by the instant the comparator output $V_{COMP2}$ flips. As long as this condition is met, there is no need to guarantee the potential of the virtual ground node $V_{X2}$ at other times. This results in a power savings improvement over traditional op-amp circuits that consume power to maintain the virtual ground node at a virtual ground potential.

Figure 5:
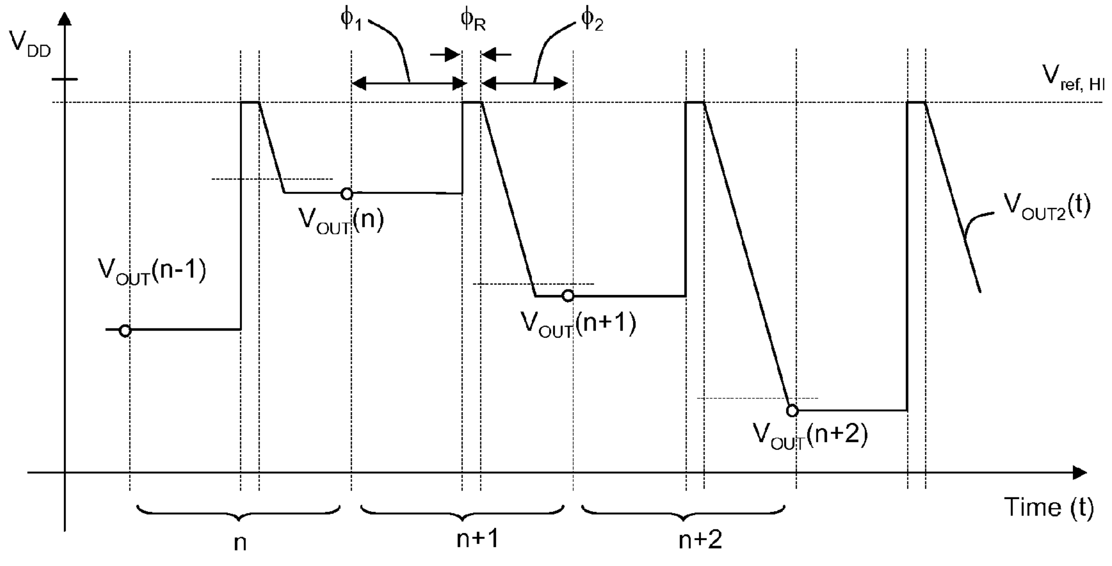
FIG. 5 is a graphical representation of the output voltage as a function of time for the circuit of FIG. 2.

FIG. 5 is a graphical representation of the output voltage $V_{OUT2}(t)$ as a function of time for the circuit of FIG. 2A. The output voltage $V_{OUT2}(t)$ is shown for at least three samples: n, n+1, and n+2. For the n+1$^{st}$ sample, the output voltage $V_{OUT2}$(t) is initially held at the previous sampled value $V_{OUT}$(n) during a first phase $\phi_1$. During a reset phase $\phi_R$, the output voltage is pulled up to the high-limit source $V_{ref,HI}$. At the conclusion of the reset phase $\phi_R$, the current source linearly discharges the voltage of the output node $V_{OUT2}$, until the comparator output changes state, which turns off the current source $I_{D2}$.

When the output voltage reaches the correct value, the virtual ground node will simultaneously be at the desired value, analogous to the traditional switched-capacitor approach using op-amps. At this point, the comparator output flips polarities, shutting off the current source, preserving the correct output voltage. The output voltage $V_{OUT}$(n+1) remains constant at least until the conclusion of the output phase $\phi_2$. The particular output voltage $V_{OUT}$(n+1) depends upon the previously stored value and the current input value. In general the comparator-based switched-capacitor implementation is applicable to all switched-capacitor networks such as A/D converters, delta-sigma modulators, amplifiers, and filters. Also note that the comparator-based switched-capacitor approach is inherently superior to the switched-op-amp technique, because all current sources connected to the output are switched off after the output phase eliminating the need to switch the op-amp on or off. There is no need to disable the comparator 32 as there had been for the op-amp 12 (FIG. 1).

The capacitor of size $C_{IN}/2$ is used in the voltage-offset network to create a DC voltage shift at the input terminal 38. This voltage shift maximizes input signal swing by setting the input referenced level to the midlevel voltage, $(V_{ref,HI}+V_{ref,LO})/2$. After one complete integration cycle, the change in charge $\Delta Q_{X2}$ is provided in Equation 2.

$$\Delta Q_{X2}=\Delta V_{X2}C_{X,tot}=(V_{ref,HI}-V_{ref,LO})C_{IN2}+(V_{ref,LO}-V_{ref,HI})C_{IN2}/2+\Delta V_{OUT2}C_{int2} \quad (2)$$

The change in voltage at the summing node is provided in Equation 3.

$$\Delta V_{X2}=\Delta Q_{X2}/C_{X,tot} \quad (3)$$

Where $C_{X,tot}$ is the sum of all capacitance is at node $V_{X2}$. The total capacitance $C_{X,tot}$ is given in Equation 4.

$$C_{X,tot}=C_{IN2}+C_{IN2}/2+C_{int2} \quad (4)$$

Because the comparator stops discharging the output node when $\Delta V_{X2}=0$, therefore $\Delta Q_X=0$ and Equation 2 can be solved for the change in voltage at the output, $\Delta V_{OUT2}$.

$$\Delta V_{OUT2}=C_{IN2}/C_{int2}(V_{IN2}-(V_{ref,LO}+V_{ref,HI})/2) \quad (5)$$

The output changes by the input value measured with respect to the mid-level voltage, with a gain determined by the capacitance ratio. This is the desired function for a discreet time integrator.

One detail of the proposed circuit is that the reference voltages, $V_{ref,LO}$ and $V_{ref,HI}$, are used instead of using a $V_{DD}$ and ground directly from the power supply. In some embodiments, the reference voltages are derived from a band-gap voltage source. It should be noted that at least one band-gap derived reference voltage is normally required in any accurate analog-to-digital converter (ADC) because using both power supply rails and signal references would allow power supply noise to leak into the system.

It is expected that the use of a second voltage reference will not affect the minimum allowed power supply voltage, $V_{DD,min}$. In order to turn on switches connected to reference voltages, $V_{DD,min}\approx V_t-|V_{rail}-V_{ref}|$, which means this design does not reach the ideal switched op-amp $V_{DD,min}$ of $V_t$. However, even in the op-amp-based design, $V_{DD}$ cannot practically be so low because of a sub-threshold leakage current.

Figure 2B:
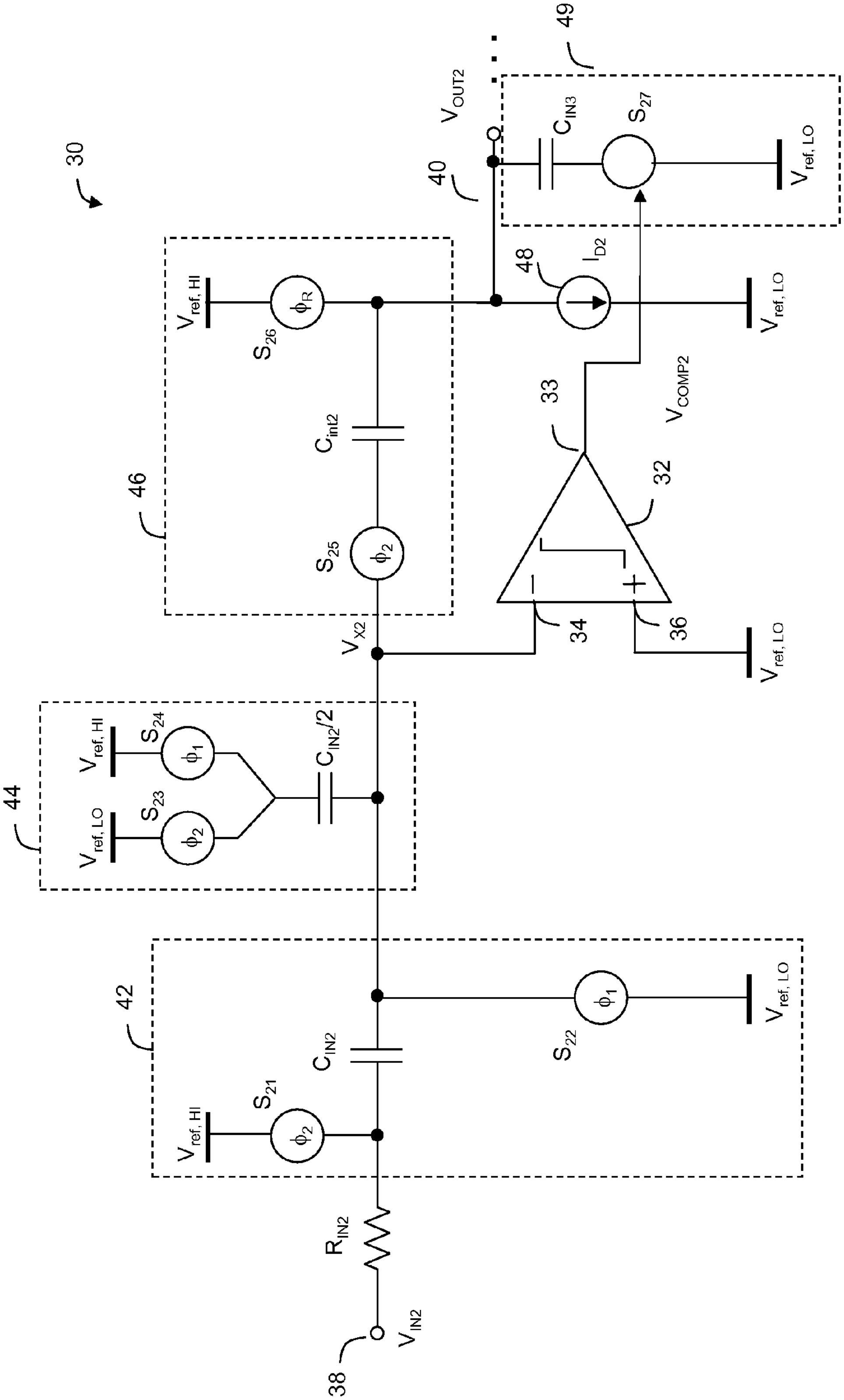
FIG. 2B is a circuit diagram of an alternative embodiment of the comparator-based switched-capacitor network shown in FIG. 2A.
Figure 2C:
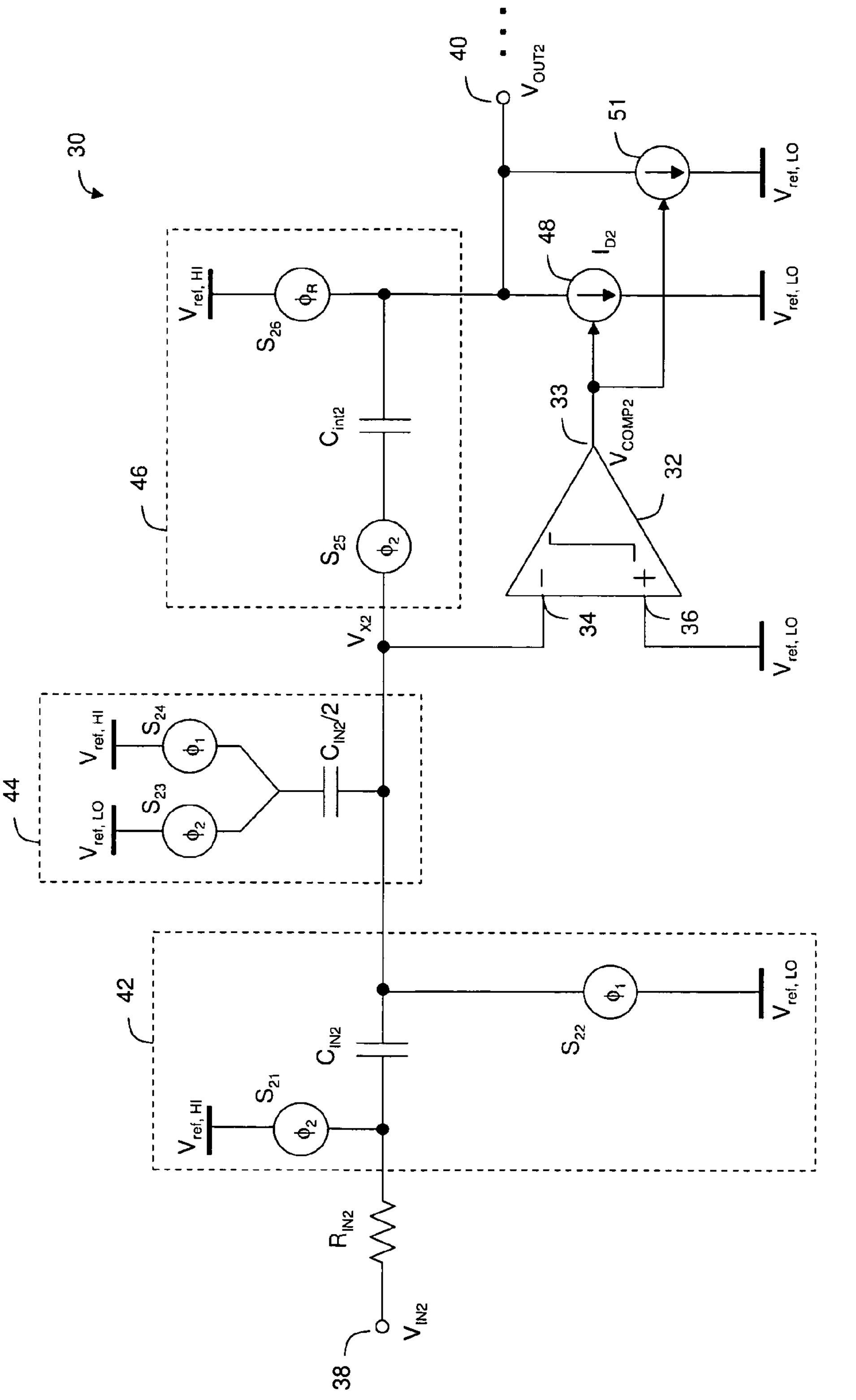
FIG. 2C is a circuit diagram of another alternative embodiment of the comparator-based switched-capacitor network shown in FIG. 2A.

In another embodiment, the output voltage $V_{OUT2}$ is coupled to a fourth switched capacitor network 49 as shown in FIG. 2B. The switched capacitor network 49 comprises at least one input capacitor $C_{IN3}$ and a sampling switch $S_{27}$. The operating principle of the illustrated embodiment is identical to that of the embodiment of FIG. 2A except the comparator output $V_{COMP2}$ controls the state of the switch $S_{27}$ instead of the current source $I_{D2}$. The sampling switch $S_{27}$ turns ON when $V_{COMP2}$ is LOW and turns off when $V_{COMP2}$ is HIGH. As in FIG. 2A, when the virtual ground node $V_{X2}$ reaches a threshold of the comparator 32 during the evaluation period, nominally equal to the voltage $V_{ref,LO}$ applied to the non-inverting input 36, the comparator output $V_{COMP2}$ changes state again. As the comparator output state $V_{COMP2}$ had been in a LOW state, it transitions to a HIGH state. This transition controls the switch $S_{27}$, effectively sampling the voltage $V_{OUT2}$ across the input capacitor $C_{IN3}$.

Figure 6:
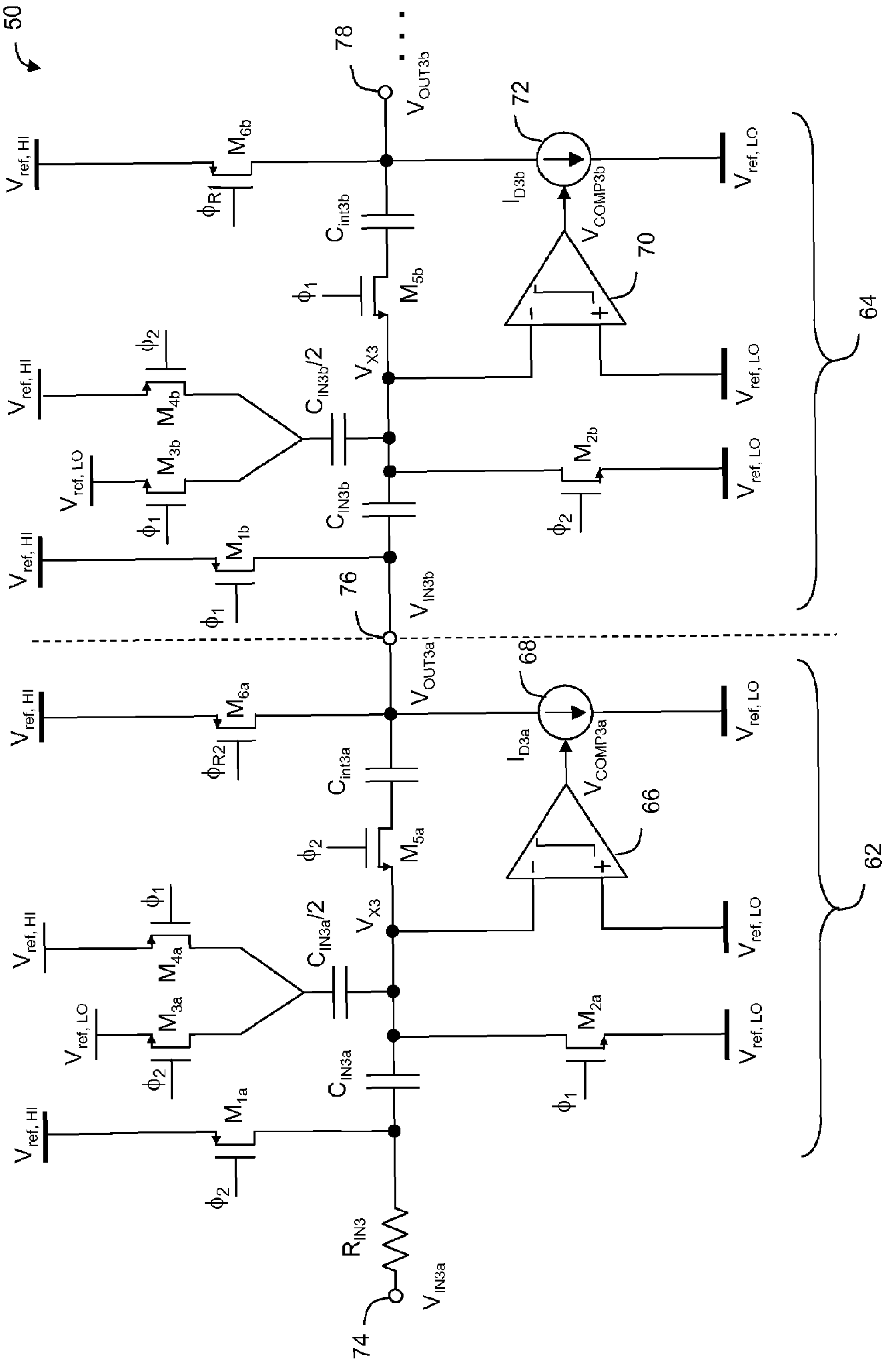
FIG. 6 is a more detailed circuit diagram of an embodiment of a multi-stage comparator-based switched-capacitor network in accordance with the present invention.

FIG. 6 is a more detailed circuit diagram of another embodiment of the invention illustrating a multi-stage comparator-based switched-capacitor network 50. The multi-stage circuit 50 includes at least two stages 62, 64, substantially similar to the comparator-based switched-capacitor integrator 30 (FIG. 2). Additionally, each of the switches has been implemented in one of an NMOS or a PMOS transistor. Generally, a PMOS transistor switch (e.g., switches $M_{1a}$, $M_{4a}$, $M_{6a}$, $M_{1b}$, $M_{4b}$, $M_{6b}$) is used when connecting to the high-limit voltage $V_{ref,\ HI}$ and an NMOS transistor switch (e.g., switches $M_{2a}$, $M_{3a}$, $M_{5a}$, $M_{2b}$, $M_{3b}$, $M_{5b}$) is used when connecting to the low-limit source $V_{ref,LO}$. In this exemplary embodiment, the input to the first stage 62 is preceded by a series resistor $R_{IN3}$, as used in the switched op-amp technique. Each of the switches of the first stage 62 is similarly controlled by a respective one of the phases $\phi_1$, $\phi_2$, $\phi_{R2}$, with $\phi_{R2}$ being the reset phase that partially overlaps $\phi_2$. In the second stage 62, the first and second phases $\phi_1$, $\phi_2$ have been reversed. Also, the reset phase $\phi_{R1}$ is used, which overlaps phase $\phi_1$ instead of $\phi_2$. Thus, in the first stage 62, switches $M_{2a}$, $M_{4a}$ are controlled by the first phase $\phi_1$; whereas, in the second stage 64, corresponding switches $M_{2b}$, $M_{4b}$ are controlled by the second phase $\phi_2$.

Likewise, in the first stage 62, switches $M_{1a}$, $M_{3a}$, and $M_{5a}$ are controlled by the second phase $\phi_2$; whereas, in the second stage 64, corresponding switches $M_{1b}$, $M_{3b}$, and $M_{5b}$ are controlled by the first phase $\phi_2$. The output voltage $V_{OUT3a}$ of the first stage 62 is equivalent to the input voltage $V_{IN3b}$ of the second stage 64. No series input resistor is necessary for the second stage 64, since the output current sources of the first stage 62 are turned off after the completion of the evaluation phase $\phi_2$. Additional stages can be cascaded in a similar manner, with the phases similarly reversed in an alternating manner between adjacent stages.

Alternatively, the comparator output $V_{COMP3a}$ controls the state of the switch $M_{2b}$ instead of controlling the current source 68, in a manner analogous to the embodiment illustrated in FIG. 2B.

Figure 7:
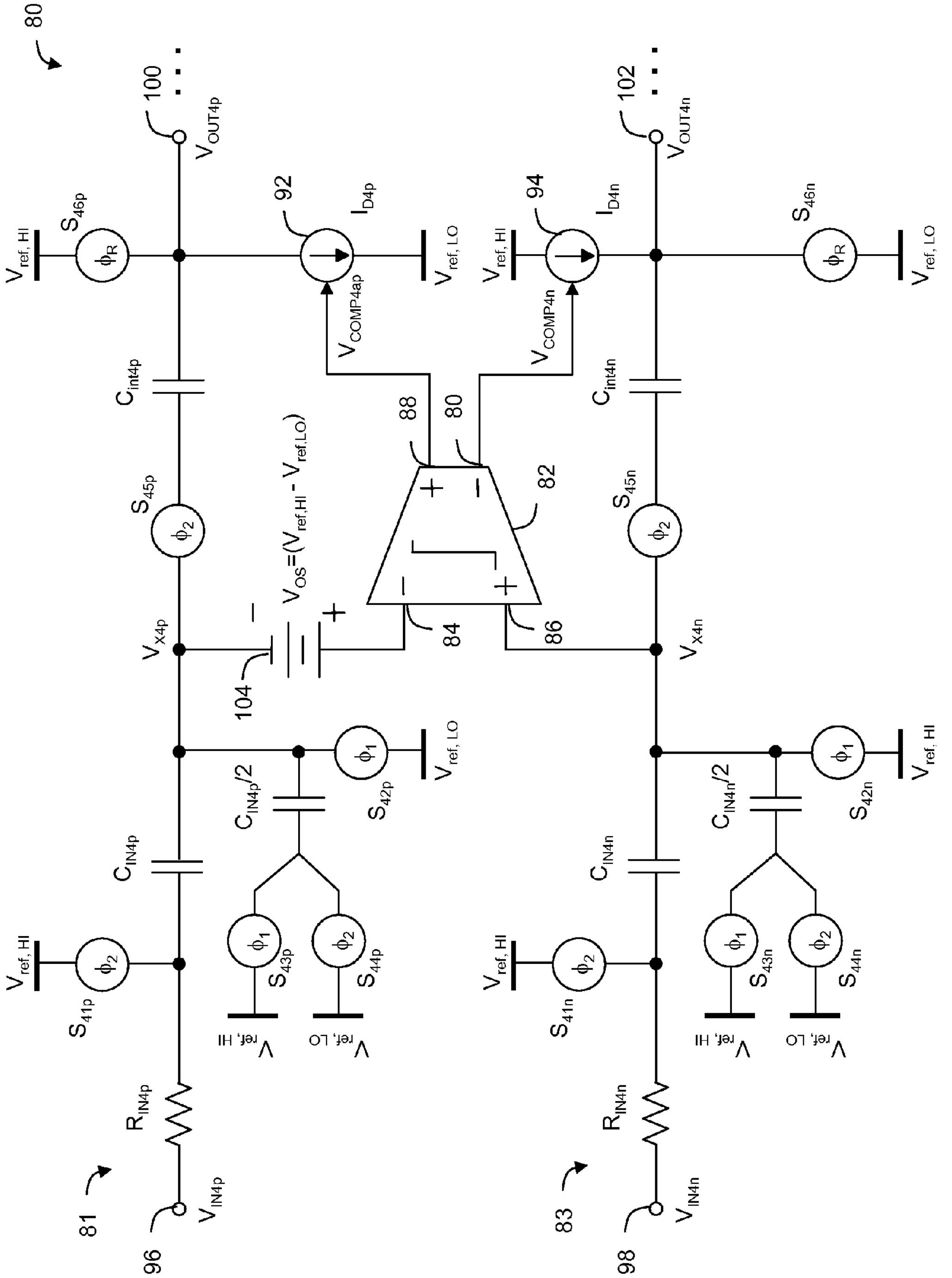
FIG. 7 is a circuit diagram of an embodiment of a differential comparator-based switched-capacitor network in accordance with the present invention.

The exemplary embodiments described thus far have been configured for single-ended signaling applications. In other embodiments, the comparator-based switched-capacitor networks are adapted for fully differential signaling applications. FIG. 7 is a circuit diagram of an embodiment of a differential comparator-based switched-capacitor integrator circuit 80. The differential circuit 80 includes a positive path 81 and a negative path 83. Each of the paths 81, 83 includes a respective input terminal 96, 98, with a differential input signal being applied between the two input terminals 96, 98.

Each of the paths 81, 83 can optionally be preceded by a series input resistor $R_{IN4p}$, $R_{IN4n}$ as described above for single-ended applications.

The positive path 81 is coupled to an inverting input terminal 84 of a differential comparator 82. Similarly, the negative path 83 is coupled to a non-inverting input terminal 86 of the same differential comparator 82. The positive path 81 includes a first switched-capacitor network including a first shunt-connected switch $S_{41p}$ connected to a high-limit source $V_{ref,HI}$, second shunt-connected switch $S_{42p}$ connected to a low-limit source $V_{ref,LO}$, with a series capacitor $C_{IN4p}$ connected therebetween. The negative path 83 includes a similar network. The positive path 81 also includes a voltage-offset network including a first series-connected switch $S_{43p}$ connected to the high-limit source $V_{ref,HI}$ and a second series-connected switch $S_{44p}$ connected to the low-limit source $V_{ref,LO}$, with one end of each switch $S_{43p}$, $S_{43n}$ further connected to one end of a series connected capacitor $C_{IN4p}/2$. Once again, the negative path 83 includes a similar voltage-offset network.

Each path 81, 83 also includes a respective second switched-capacitor network. Each of the second switched-capacitor networks includes a respective feedback capacitor $C_{int4p}$, $C_{int4n}$ and series-connected feedback switch $S_{45p}$, $S_{45n}$ coupled between the respective output terminal 100, 102 and a respective virtual ground node $V_{X4p}$, $V_{X4n}$. The second switched-capacitor network of the positive path 81 includes a reset switch $S_{46p}$ connecting the positive output terminal 100 to the high voltage reference $V_{ref,HI}$ during the brief reset phase, $\phi_R$. Similarly, the second switched-capacitor network of the negative path 83 includes a reset switch $S_{46n}$ connecting the negative output terminal 102 to the low-limit source $V_{ref,LO}$ during the same brief reset phase, $\phi_R$. In general, during the reset phase, the outputs are reset to opposite references. With the reset phase overlapping an initial portion of the evaluation phase $\phi_2$, the feedback capacitors $C_{int4p}$, $C_{int4n}$ are connected by the closed switches $S_{45p}$, $S_{45n}$ to their respective differential virtual ground nodes $V_{X3p}$, $V_{X4n}$.

During the evaluation phase $\phi_2$, the output voltages $V_{OUT4p}$, $V_{OUT4n}$ are then swept in opposite directions by the respective current source $I_{D4p}$, $I_{D4n}$, which allows the output common-mode voltage to remain at mid-level at all times during the integration cycle.

The fully differential comparator will include an offset voltage source $V_{OS}$ 104 at one of the input terminals 84 with a voltage value equal to $V_{ref,HI}-V_{ref,LO}$. The offset voltage source 104 is required because the positive virtual ground node $V_{X4p}$ has a nominal voltage of $V_{ref,LO}$, while the negative virtual ground node $V_{X4n}$ has a nominal voltage of $V_{ref,HI}$.

When the output has the correct value, $V_{Xn}-V_{Xp}=V_{ref,HI}-V_{ref,LO}$, the differential comparator output state changes and the current sources $I_{D4p}$, $I_{D4n}$ are turned off. The output voltages $V_{OUT4p}$, $V_{OUT4n}$ remain substantially constant for at least the remainder of the integration phase. Ignoring common-mode adjustments, $V_{Xp}\approx V_{ref,LO}$ and $V_{Xn}\approx V_{ref,HI}$.

Preferably, applications using the low-voltage comparator-based switched-capacitor network operate as fast as possible. The comparator only needs to be very accurate for input voltages close to $V_{ref,HI}$ (plus some margin for common-mode adjustments). It will most likely consist of a number of cascaded gains stages.

In some embodiments, one or more similar differential stages can be cascaded with the input of one stage being taken from the output of a preceding stage. As described above in relation to FIG. 6, the first and second clock phases ϕ1, ϕ2 would be inverted in an alternating manner between adjacent stages. In alternative embodiments, the comparator outputs $V_{COMP4sp}$ and $V_{COMP4an}$ control sampling switches of additional switched-capacitor networks in a manner similar to the embodiment shown in FIG. 2B.

Figure 8:
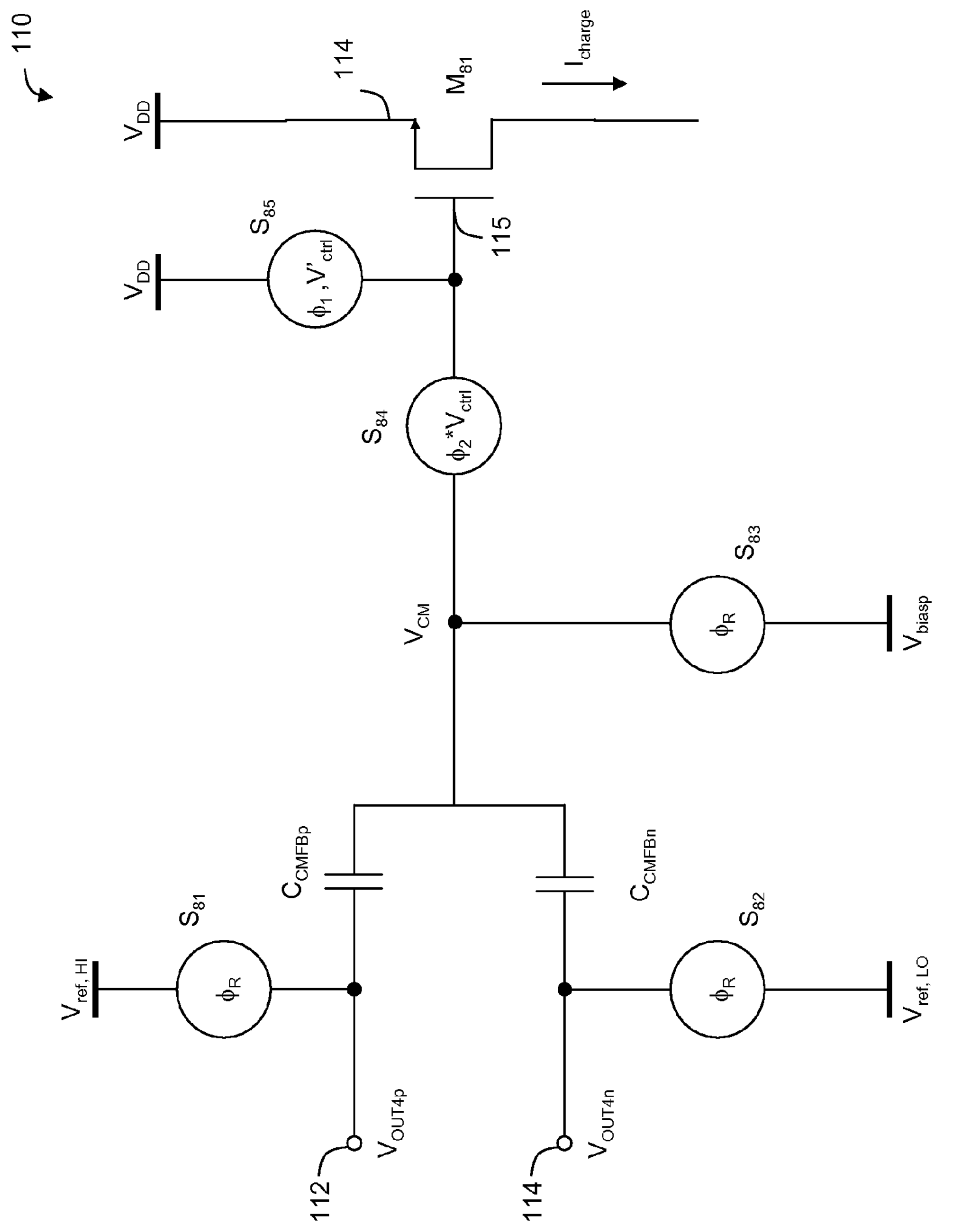
FIG. 8 is a circuit diagram of an embodiment of an optional common-mode feedback network that can be applied to the differential circuit of FIG. 7 in accordance with the present invention.

FIG. 8 illustrates one embodiment of a common-mode feedback circuit 110 that can be incorporated into the differential integrator 80 (FIG. 7) to control the output common-mode voltage. The common-mode feedback circuit 110 includes a first input 112 coupled to a common-mode reference node $V_{CM}$ through a first common-mode feedback capacitor $C_{CMFBp}$. The input end of the capacitor $C_{CMFBp}$ is coupled to the high-limit voltage $V_{ref,HI}$ through a series connected switch $S_{81}$ controlled by the reset clock phase $\phi_R$. The common-mode feedback circuit 110 also includes a second input 114 coupled to the common-mode reference node $V_{CM}$ through a second common-mode feedback capacitor $C_{CMFBn}$. The input end of the capacitor $C_{CMFBn}$ is coupled to the low-limit source $V_{ref,LO}$ through a series connected switch $S_{82}$ also controlled by the reset clock phase $\phi_R$.

The common-mode reference node $V_{CM}$ is connected to a bias potential $V_{biasp}$ through a series connected switch $S_{83}$, also controlled by the reset clock phase $\phi_R$ and to a control terminal 115 (i.e., gate) of a transistor $M_{81}$. $V_{biasp}$ controls the nominal value of offset current $I_{charge}$. Another terminal of the transistor 116 (i.e., the source) is coupled to the positive power supply rail, $V_{DD}$. The series-connected switch $S_{84}$ is controlled by a signal determined as the product (i.e., AND) of the second input clock phase $\phi_2$ and a control signal $V_{ctrl}$. $V_{ctrl}$ is derived from the output of the comparator 82 (FIG. 7) and is used to turn on and off the current source transistor $M_{81}$. The control terminal 115 is further coupled to the positive power supply rail voltage $V_{DD}$ through a second series-connected switch $S_{85}$. The second series-connected switch $S_{85}$ is controlled by a signal determined as the OR combination of the first clock phase $\phi_1$ and the complement of voltage control signal $V_{ctrl}$. A third terminal of the transistor $M_{81}$ is coupled to the respective charging discharging current source $I_{D4p}$, $I_{D4n}$, supplying an offset current $I_{charge}$ to counter a drift in the common mode voltage level.

Two common-mode feedback capacitors $C_{CMFBp}$, $C_{CMFBn}$ create a voltage divider between the positive and negative integrator outputs 102, 104 such that node $V_{CM}$ tracks the integrator's output common-mode voltage. During the reset phase, the voltage across these capacitors $C_{CMFBp}$, $C_{CMFBn}$ is set such that the operating point of the node $V_{CM}$ is equal to the desired gate voltage of the current source transistor $M_{81}$ to balance $I_{D4p}$, $I_{D4n}$. As the potential of the node $V_{CM}$ drifts away from its operating point voltage, the gate voltage of current source transistor $M_{81}$ is adjusted to adjust the current $I_{charge}$ that counters this common-mode drift. Although only one is necessary, two of these common-mode feedback circuits 110 can be used: one for the positive path 81 and one for the negative path 83 of the differential integrator 80.

Low-voltage comparator-based switched-capacitor networks can be used as building blocks in a variety of analog and mixed-signal applications, such as filters and analog-digital converters. For example, the low-voltage comparator-based switched-capacitor networks can be used to implement a sigma-delta analog to digital converter (ADC), such as the sigma-delta ADC described in U.S. patent application Ser. No. 11/343,064, filed Jan. 30, 2006, entitled "Comparator-Based Switched Capacitor Circuit for Scaled Semiconductor Fabrication Processes," the entirety of which is incorporated herein by reference. In some embodiments, such an ADC can provide 12 to 14 bits of resolution with an input bandwidth of 200 kHz to 3 MHz.

While the invention has been shown and described with reference to specific embodiments, it should be understood by those skilled in the art that various changes in form and detail may be made therein without departing from the spirit and scope of the invention. For example, the descriptions above are directed to an integrator; however, the switched-capacitor network of the present invention can be utilized in other circuit embodiments such as sample-and-hold circuits, analog-to-digital converters and filters.

What is claimed is:

1. A network for performing an analog circuit function comprising:

a first switched-capacitor network having an input terminal to receive an input voltage and a plurality of switches, each switch having a respective threshold voltage and in communication with one of a high-limit voltage, a low-limit voltage, and electrical ground;

a comparator having a comparator output terminal, a first comparator input terminal, and a second comparator input terminal, the first comparator input terminal in communication with the first switched-capacitor network and configured to receive a node voltage therefrom during a first phase for sampling of the input voltage, the second comparator input terminal configured to receive one of the high-limit voltage and the low-limit voltage, the comparator providing a first voltage or a second voltage at the comparator output terminal according to whether a voltage at the first comparator input terminal exceeds a voltage at the second comparator input terminal;

a voltage-offset network in communication with the first comparator input terminal, the voltage-offset network providing a voltage shift at the first comparator input terminal setting an input reference level at a mid-level voltage with respect to the high-limit and low-limit voltages;

a first controllable current source coupled to a network output terminal and having a control terminal coupled to the comparator output terminal, the first controllable current source supplying a current during a second phase to sweep a network output voltage toward one of the high-limit and low-limit voltages;

a second switched-capacitor network coupled at one end to the first comparator input terminal and at another end to the network output terminal;

a reset circuit coupled to the network output terminal and charging the second switched-capacitor network to the other one of the high-limit voltage and the low-limit voltage between the first phase and the second phase; and a second controllable current source having a control terminal in communication with the network output terminal and supplying a current to compensate for a voltage error generated by a finite delay in a response of the comparator.

2. The network of claim 1, wherein each switch of the plurality of switches is selected from the group consisting of NMOS transistor and PMOS transistors.

3. The network of claim 1, wherein the switched-capacitor network is implemented in CMOS.

4. The network of claim 1, wherein the current source comprises a transistor.

5. The network of claim 1, wherein the second switched-capacitor network includes a feedback capacitor, the analog circuit function comprising integration of the input voltage.

6. The network of claim 1, further comprising a series-connected resistor receiving the input voltage at the input terminal of the first switched-capacitor network.

7. The network of claim 1, further comprising a substantially similar second stage having an input terminal in communication with the network output terminal.

8. The network of claim 7, further comprising a common-mode correction network coupled to the network output terminal and injecting a current thereto derived from a common-mode signal.

9. The network of claim 1, wherein the input voltage is obtained from a differential input signal and wherein the first and second switched-capacitor networks, the comparator, and the voltage-offset network are adapted for differential signal operation.

10. The network of claim 1, wherein the comparator is a non-clocked comparator.

11. A network for performing an analog circuit function comprising:

a first switched-capacitor network having an input terminal to receive an input voltage and a plurality of switches, each switch having a respective threshold voltage and in communication with one of a high-limit voltage, a low-limit voltage, and electrical ground;

a comparator having a comparator output terminal, a first comparator input terminal, and a second comparator input terminal, the first comparator input terminal in communication with the first switched-capacitor network and configured to receive a node voltage therefrom during a first phase for sampling of the input voltage, the second comparator input terminal configured to receive one of the high-limit voltage and the low-limit voltage, the comparator providing a first voltage or a second voltage at the comparator output terminal according to whether a voltage at the first comparator input terminal exceeds a voltage at the second comparator input terminal;

a voltage-offset network in communication with the first comparator input terminal, the voltage-offset network providing a voltage shift at the first comparator input terminal setting an input reference level at a mid-level voltage with respect to the high-limit and low-limit voltages;

a sampling capacitor coupled to a network output terminal;

a sampling switch coupled between the sampling capacitor and the one of the high-limit and low-limit voltages, the sampling switch having a control terminal coupled to the comparator output terminal;

a controllable current source coupled to the network output terminal and having a control terminal coupled to the comparator output terminal, the controllable current source supplying a current during a second phase to sweep a network output voltage toward one of the high-limit and low-limit voltages;

a second switched-capacitor network coupled at one end to the first comparator input terminal and at another end to the network output terminal; and a reset circuit coupled to the network output terminal and charging the second switched-capacitor network to the other one of the high-limit and low-limit voltages between the first phase and the second phase.

12. The network of claim 11, further comprising a second controllable current source having a control terminal in communication with the network output terminal and supplying a current to compensate for a voltage error generated by a finite delay in a response of the comparator.

13. The network of claim 11, wherein each switch of the plurality of switches is selected from the group consisting of NMOS transistor and PMOS transistors.

14. The network of claim 11, wherein the switched-capacitor network is implemented in CMOS.

15. The network of claim 11, wherein the current source comprises a transistor.

16. The network of claim 11, wherein the second switched-capacitor network includes a feedback capacitor, the analog circuit function comprising integration of the input voltage.

17. The network of claim 11, further comprising a series-connected resistor receiving the input voltage at the input terminal of the first switched-capacitor network.

18. The network of claim 11, further comprising a substantially similar second stage having an input terminal in communication with the network output terminal.

19. The network of claim 18, further comprising a common-mode correction network coupled to the network output terminal and injecting a current thereto derived from a common-mode signal.

20. The network of claim 11, wherein the input voltage is obtained from a differential input signal and wherein the first and second switched-capacitor networks, the comparator, and the voltage-offset network are adapted for differential signal operation.

21. The network of claim 11, wherein the comparator is a non-clocked comparator.

* * * * *